United States Patent
Wada et al.

(10) Patent No.: US 11,726,118 B2
(45) Date of Patent: Aug. 15, 2023

(54) FREQUENCY DETECTION CIRCUIT

(71) Applicant: Mitsubishi Electric Corporation, Tokyo (JP)

(72) Inventors: Osamu Wada, Tokyo (JP); Kenichi Tajima, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 265 days.

(21) Appl. No.: 17/351,597

(22) Filed: Jun. 18, 2021

(65) Prior Publication Data

US 2021/0311098 A1 Oct. 7, 2021

Related U.S. Application Data

(63) Continuation of application No. PCT/JP2019/001761, filed on Jan. 22, 2019.

(51) Int. Cl.
*G01R 23/04* (2006.01)
*G01R 23/16* (2006.01)

(52) U.S. Cl.
CPC ............. *G01R 23/04* (2013.01); *G01R 23/16* (2013.01)

(58) Field of Classification Search
CPC .................................. G01R 23/04; G01R 23/16
See application file for complete search history.

(56) References Cited

U.S. PATENT DOCUMENTS

| | | | |
|---|---|---|---|
| 2007/0109159 A1* | 5/2007 | Stein | G11B 5/09 |
| 2007/0250279 A1 | 10/2007 | Moll | |
| 2020/0322060 A1 | 10/2020 | Sakamoto | |

FOREIGN PATENT DOCUMENTS

| | | | | |
|---|---|---|---|---|
| JP | 2009162662 A | * | 7/2009 | |
| JP | 2017-216604 A | | 12/2017 | |
| WO | WO-2018154747 A1 | * | 8/2018 | G01R 23/16 |

OTHER PUBLICATIONS

Japanese Notice of Reasons for Refusal, issued in JP Patent Application No. 2020-563731 dated Dec. 15, 2020.
Suematsu et al., "A Proposal of Wide-Band Real-Time Frequency Monitoring Based on Direct RF Undersampling Receiver", Institute of Electronics, Information and Communication Engineers Electronics Society Conference, C-2-70, 2017, total 4 pages.

* cited by examiner

*Primary Examiner* — Kyle R Quigley
*Assistant Examiner* — Xiuqin Sun
(74) *Attorney, Agent, or Firm* — Birch, Stewart, Kolasch & Birch, LLP

(57) ABSTRACT

A frequency detection circuit includes: a first signal source for outputting a first clock signal; a second signal source for outputting a second clock signal having the same frequency as but a different phase from those of the first clock signal; a first sample hold circuit for undersampling a reception signal using the first clock signal; a second sample hold circuit for undersampling the reception signal using the second clock signal; and a frequency calculating circuit for calculating the frequency of the reception signal using a phase difference between output signals of the first sample hold circuit and the second sample hold circuit.

9 Claims, 6 Drawing Sheets

FREQUENCY DETECTION CIRCUIT

CROSS REFERENCE TO RELATED APPLICATION

This application is a Continuation of PCT International Application No. PCT/JP2019/001761, filed on Jan. 22, 2019, which is hereby expressly incorporated by reference into the present application.

TECHNICAL FIELD

The present invention relates to a frequency detection circuit.

BACKGROUND ART

Frequency detection circuits are circuits for identifying the frequency of any signal input thereto. For example, a frequency detection circuit is configured using a frequency converter such as a mixer, an analog to digital converter (ADC), an arithmetic circuit (also referred to as "logic circuit" or "digital circuit") such as a field programmable gate array (FPGA).

As a conventional frequency detection circuit, for example, Patent Literature 1 describes a configuration in which a plurality of systems each including a sampler and an ADC is parallelized. In this frequency detection circuit, time interleaving is performed. The sampling frequency is the same for each system, but the sampling timing is shifted. Conversion into a digital signal is performed, and the digital signals obtained in respective systems are combined. By sampling at different timing in the plurality of systems, the sampling speed can be improved equivalently, and thus the frequency of an input signal can be identified accurately. For example, in a case where there are x systems for sampling with a clock signal having a frequency "$f_c$", this is equivalent to operating, as the frequency detection circuit as a whole, with a clock signal having a frequency $x \cdot f_c$. Assuming that the frequency of an input signal is "$f_{in}$", from the sampling theorem, if $f_{in} \leq 2 \cdot x \cdot f_c$, $f_{in}$ can be identified correctly since it is oversampling.

CITATION LIST

Patent Literature

JP 2017-216604 A

SUMMARY OF INVENTION

Technical Problem

However, in the frequency detection circuit in Patent Literature 1, there is a problem that when $f_{in}$ becomes high since it is necessary to increase the number of parallel systems x, the scale of the frequency detection circuit increases.

The present invention has been made in order to solve the above problems, and an object of the present invention is to provide a frequency detection circuit capable of detecting a frequency while the number of parallel systems is maintained even when an input signal has a higher frequency.

Solution to Problem

A frequency detection circuit of the present invention includes: a first signal source to output a first clock signal; a second signal source to output a second clock signal having the same frequency as but a different phase from those of the first clock signal; a first sample hold circuit to undersample a reception signal using the first clock signal, and to output the undersampled reception signal as an output signal; a second sample hold circuit to undersample the reception signal using the second clock signal, and to output the undersampled reception signal as an output signal; and a frequency calculating circuit for calculating the frequency of the reception signal using a phase difference between output signals of the first sample hold circuit and the second sample hold circuit, wherein the frequency calculating circuit detects a frequency of the output signal of the first sample hold circuit, calculates an order of undersampling with respect to the reception signal using the phase difference, and calculates the frequency of the reception signal from the calculated order and the detected frequency.

Advantageous Effects of Invention

According to the present invention, it is possible to identify the frequency while the number of parallel systems is maintained regardless of the frequency of an input signal.

DESCRIPTION OF EMBODIMENTS

First Embodiment

Figure 1:
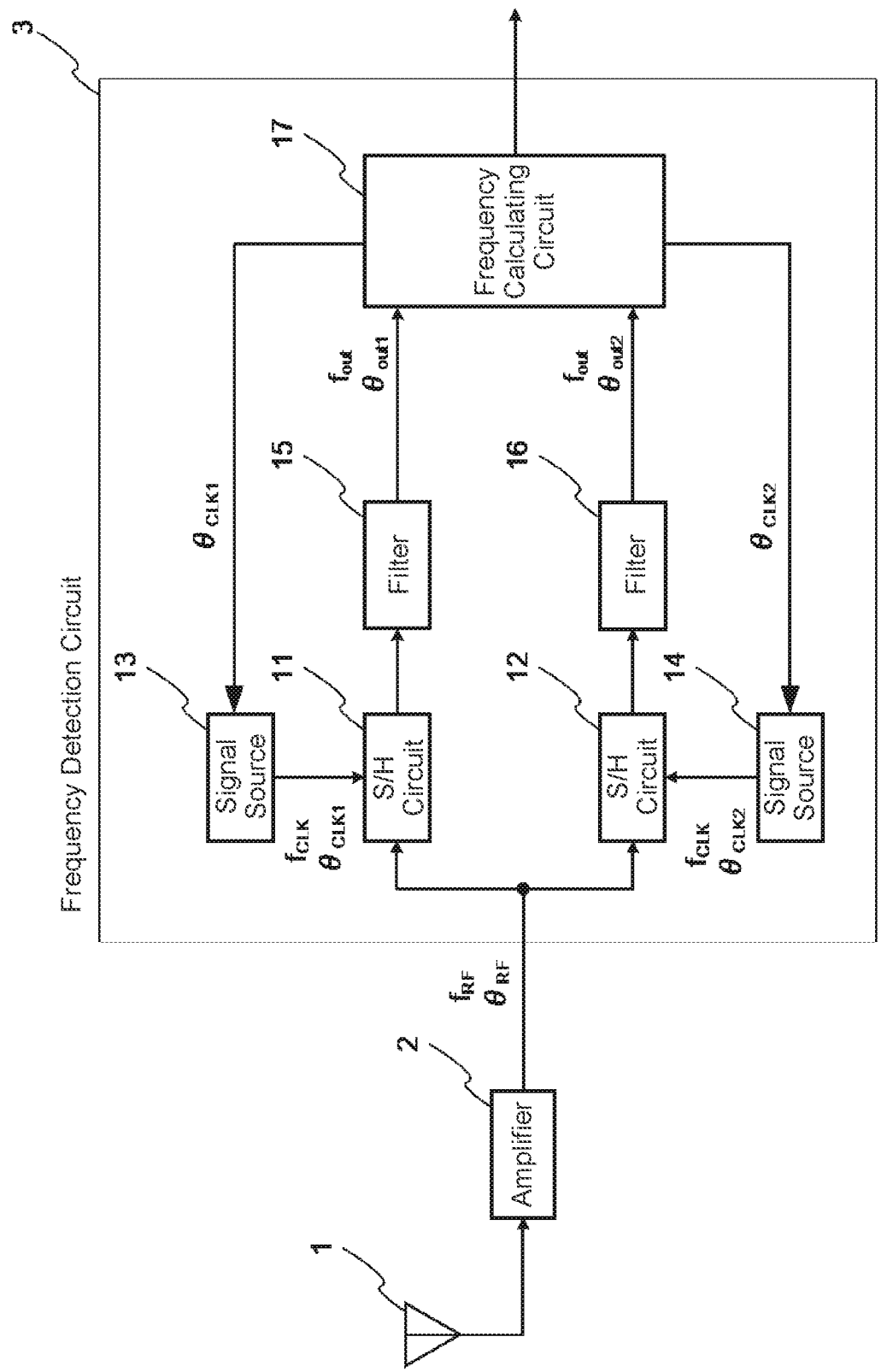
FIG. 1 is a configuration diagram illustrating a configuration example of a receiver according to a first embodiment of the present invention.

FIG. 1 is a configuration diagram illustrating a configuration example of a receiver according to a first embodiment of the present invention.

This receiver includes an antenna 1, an amplifier 2, and a frequency detection circuit 3, and the frequency detection circuit 3 includes an S/H circuit 11, an S/H circuit 12, a signal source 13, a signal source 14, a filter 15, a filter 16, and a frequency calculating circuit 17. Symbol "$f_{RF}$" denotes the frequency of an input signal of the frequency detection circuit 3, "$\theta_{RF}$" denotes the phase of an input signal of the frequency detection circuit 3, "$f_{CLK}$" denotes the frequency of an output signal of the signal source 13, "$f_{CLK}$" denotes the frequency of an output signal of the signal source 14, "$\theta_{CLK1}$" denotes the initial phase of an output signal of the signal source 13, "$\theta_{CLK2}$" denotes the initial phase of an output signal of the signal source 14, "$f_{out}$" denotes the frequency of an output signal of the filter 15, "$\theta_{out1}$" denotes the initial phase of an output signal of the filter 15, and "$\theta_{out2}$" denotes the initial phase of an output signal of the filter 16.

The antenna 1 is an antenna configured to receive a signal propagated through space and output the signal to the amplifier 2. The output terminal of the antenna 1 is connected to the input terminal of the amplifier 2. For example, a dipole antenna or a patch antenna can be used as the antenna 1. Of course, an array antenna in which a plurality of element antennas is combined may be used. Note that the antenna 1 may have any configuration as long as the antenna can receive a signal propagated through space and output the received signal.

The amplifier 2 amplifies the power of the signal output by the antenna 1 and outputs the signal to the frequency detection circuit 3. Note that it is desirable that the amplifier 2 amplifies the power to an extent that the noise added by the amplifier 2 is small and that the influence of a noise index of a frequency detection circuit 3 is negligible. An input terminal of the amplifier 2 is connected to an output terminal of the antenna 1, and an output terminal of the amplifier 2 is connected to an input terminal of the frequency detection circuit 3. For example, the amplifier 2 includes discrete transistors. Note that the amplifier 2 may have any configuration as long as it can amplify and output the power of an input signal.

The frequency detection circuit 3 identifies the frequency of a signal input thereto and outputs a signal indicating the frequency. The frequency detection circuit 3 identifies $f_{RF}$ from a signal input from the amplifier 2 and outputs a signal indicating $f_{RF}$. The input terminal of the frequency detection circuit 3 is connected to the output terminal of the amplifier 2.

The S/H circuit 11 is a sample and hold (also called "track and hold") circuit that undersamples (also called "subsampling") the signal output by the amplifier 2 in synchronization with a first clock signal output by the signal source 13 and outputs the undersampled signal to the filter 15. An RF terminal of the S/H circuit 11 is connected to the output terminal of the amplifier 2, a clock terminal of the S/H circuit 11 is connected to an output terminal of the signal source 13, and an output terminal of the S/H circuit 11 is connected to an input terminal of the filter 15. For example, as the S/H circuit 11, a circuit is used, which includes a switch for switching between open and short for a line for an RF signal input thereto (output signal of the amplifier 2) and a capacitor for storing charges when the line is open for the RF signal input thereto. The S/H circuit 11 may have any configuration as long as it can undersample an RF signal input thereto and output the undersampled signal. Here, the undersampled signal refers to a signal generated by undersampling.

The S/H circuit 12 is a sample and hold circuit that undersamples the signal output by the amplifier 2 in synchronization with a second clock signal output by the signal source 14 and outputs the undersampled signal to the filter 16. An RF terminal of the S/H circuit 12 is connected to the output terminal of the amplifier 2, a clock terminal of the S/H circuit 12 is connected to an output terminal of the signal source 14, and an output terminal of the S/H circuit 12 is connected to an input terminal of the filter 16. For example, as the S/H circuit 12, a circuit is used, which includes a switch for switching between open and short for a line for an RF signal input thereto and a capacitor for storing charges when the line is open for the RF signal input thereto. The S/H circuit 12 may have any configuration as long as it can undersample an RF signal input thereto and output the undersampled signal.

The signal source 13 is a circuit capable of generating a signal having a desirable signal waveform or a desirable frequency and generates the first clock signal to be input to the S/H circuit 11 on the basis of data of $\theta_{CLK1}$ output by the frequency calculating circuit 17. A control terminal of the signal source 13 is connected to a first output terminal of the frequency calculating circuit 17, and the output terminal of the signal source 13 is connected to the clock terminal of the S/H circuit 11. For example, a digital-to-analog converter (DAC), a direct digital synthesizer (DDS), or a phase locked loop (PLL) circuit is used as the signal source 13. Note that, although not illustrated in FIG. 1, the signal source 13 may generate the first clock signal using a control signal or a reference signal input from the outside. As the signal source 13, any circuit may be used as long as it can generate a signal having a desired signal waveform or a desired frequency.

The signal source 14 is a circuit capable of generating a signal having a desirable signal waveform or a desirable frequency and generates the second clock signal to be input to the S/H circuit 12 on the basis of data of $\theta_{CLK2}$ output by the frequency calculating circuit 17. A control terminal of the signal source 14 is connected to a second output terminal of the frequency calculating circuit 17, and the output terminal of the signal source 14 is connected to the clock terminal of the S/H circuit 12. For example, a DAC, a DDS, or a PLL circuit is used as the signal source 14. Note that, although not illustrated in FIG. 1, the signal source 14 may generate the second clock signal using a control signal or a reference signal input from the outside. As the signal source 14, any circuit may be used as long as it can generate a signal having a desired signal waveform or a desired frequency.

The filter 15 is a filter that has a predetermined pass band, part of the signals output by the S/H circuit 11 being allowed to pass through the filter as being within the pass band, and the remaining part of the signals being suppressed by the filter as being outside the pass band. The filter 15 suppresses signals and unnecessary waves outside the pass band out of the signal output by the S/H circuit 11 and outputs the signal to the frequency calculating circuit 17. The input terminal of the filter 15 is connected to the output terminal of the S/H circuit 11, and an output terminal of the filter 15 is connected to a first input terminal of the frequency calculating circuit 17. For example, a low pass filter (LPF), a high pass filter (HPF), or a band pass filter (BPF) is used as the filter 15. The filter 15 is implemented using a chip inductor, a chip capacitor, or the like. Depending on a frequency band to be passed or the amount of suppression required, another microstrip or a resonator such as a coaxial resonator may be used.

The filter 16 is a filter that has a predetermined pass band, part of the signals output by the S/H circuit 12 being allowed to pass through the filter as being within the pass band, and the remaining part of the signals being suppressed by the filter as being outside the pass band. The filter 16 suppresses signals and unnecessary waves outside the pass band out of the signal output by the S/H circuit 12 and outputs the signal to the frequency calculating circuit 17. The input terminal of the filter 16 is connected to the output terminal of the S/H circuit 12, and an output terminal of the filter 16 is connected to a second input terminal of the frequency calculating circuit 17. For example, an LPF, a HPF, or a BPF is used as the filter 16. The filter 16 is implemented using a chip inductor, a chip capacitor, or the like. Depending on a frequency band to be passed or the amount of suppression required, another microstrip or a resonator such as a coaxial resonator may be used.

The frequency calculating circuit 17 identifies $f_{RF}$ from the signals output by the filter 15 and the filter 16, outputs the results, and further outputs data indicating $\theta_{CLK1}$ and $\theta_{CLK2}$ to the signal source 13 and the signal source 14, respectively. The first input terminal of the frequency calculating circuit 17 is connected to the output terminal of the filter 15, the second input terminal of the frequency calculating circuit 17 is connected to the output terminal of the filter 16, the first output terminal of the frequency calculating circuit 17 is connected to the control terminal of the signal source 13, and the second output terminal of the frequency calculating circuit 17 is connected to the control terminal of the signal source 14.

Figure 2:
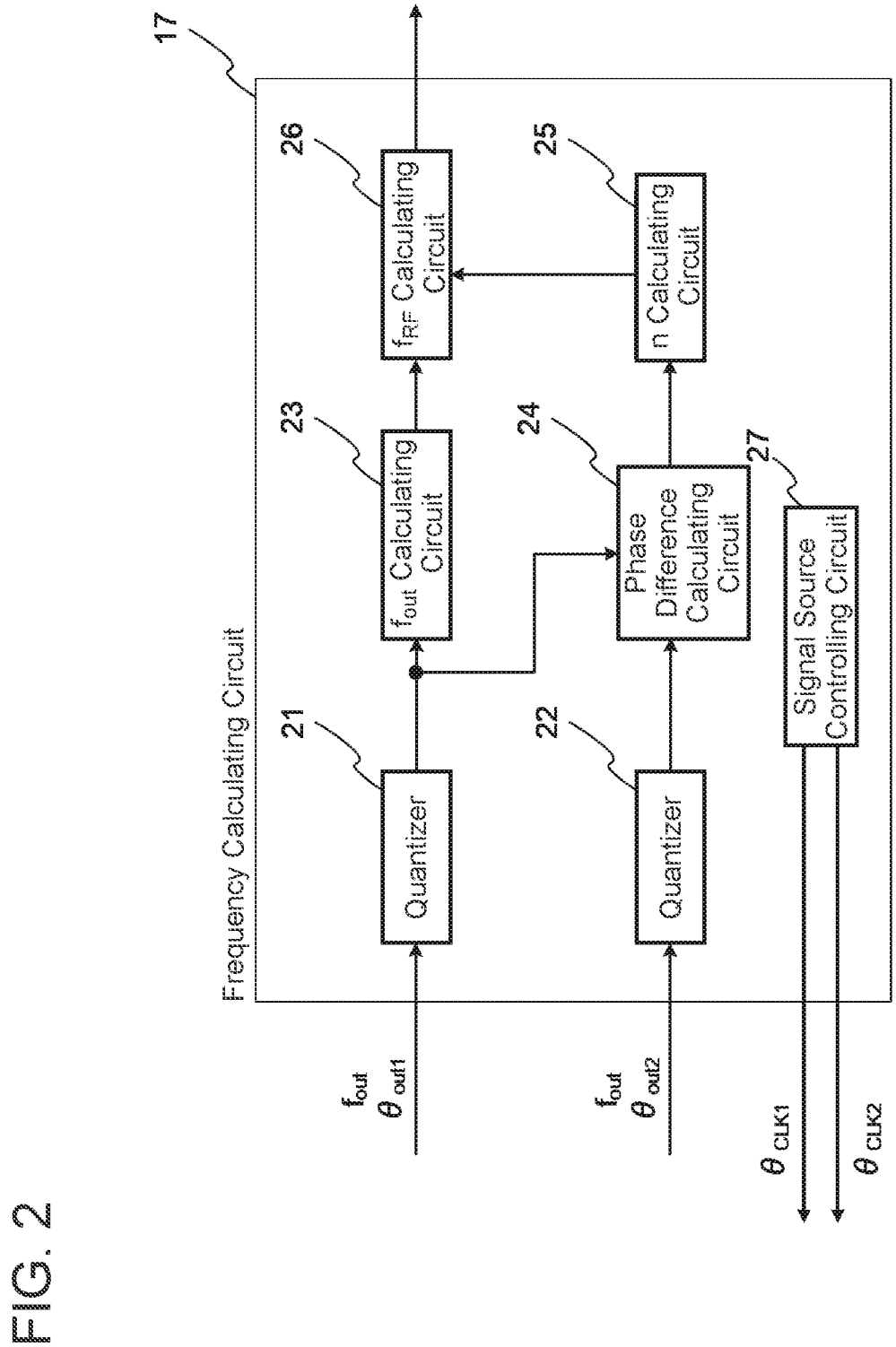
FIG. 2 is a configuration diagram illustrating a configuration example of a frequency calculating circuit 17 according to the first embodiment of the present invention.

FIG. 2 is a configuration diagram illustrating a configuration example of the frequency calculating circuit 17 according to the first embodiment of the present invention. The frequency calculating circuit 17 includes a quantizer 21, a quantizer 22, a $f_{out}$ calculating circuit 23, a phase difference calculating circuit 24, an n calculating circuit 25, an $f_{RF}$ calculating circuit 26, and a signal source controlling circuit 27. Note that "n" is the degree of undersampling (also referred to as "the order of a clock signal") and is an integer that satisfies the following Equation 1.

$$f_{RF}=|n \cdot f_{CLK}+f_{out}| \qquad (1)$$

The quantizer 21 is a circuit that quantizes a signal input thereto and outputs data of the quantized signal. The quantizer 21 quantizes the signal output by the filter 15 and outputs data of the quantized signal to the $f_{out}$ calculating circuit 23 and the phase difference calculating circuit 24. An input terminal of the quantizer 21 is connected to the output terminal of the filter 15, and an output terminal of the quantizer 21 is connected to an input terminal of the $f_{out}$ calculating circuit 23 and the first input terminal of the phase difference calculating circuit 24. For example, an ADC can be used as the quantizer 21. Note that, in a case where an ADC is used as the quantizer 21, quantization may be performed in synchronization with a clock signal input from the outside. The quantizer 21 may have any configuration as long as it can quantize a signal input thereto and output data of the quantized signal.

The quantizer 22 is a circuit that quantizes a signal input thereto and outputs data of the quantized signal. The quantizer 22 quantizes the signal output by the filter 16 and outputs data of the quantized signal to the phase difference calculating circuit 24. An input terminal of the quantizer 22 is connected to the output terminal of the filter 16, and an output terminal of the quantizer 22 is connected to a second input terminal of the phase difference calculating circuit 24. For example, an ADC can be used as the quantizer 22. Note that, in a case where an ADC is used as the quantizer 22, quantization may be performed in synchronization with a clock signal input from the outside. The quantizer 22 may have any configuration as long as it can quantize a signal input thereto and output data of the quantized signal.

The $f_{out}$ calculating circuit 23 is a circuit for calculating the frequency of a signal input thereto and thus calculates, from the signal output by the quantizer 21, frequency $f_{out}$ of the output signal and outputs the calculated $f_{out}$ to the $f_{RF}$ calculating circuit 26. The input terminal of the $f_{out}$ calculating circuit 23 is connected to the output terminal of the quantizer 21, and an output terminal of the $f_{out}$ calculating circuit 23 is connected to a first input terminal of the $f_{RF}$ calculating circuit 26. For example, an FPGA can be used as the $f_{out}$ calculating circuit 23. At this point, the FPGA calculates $f_{out}$ by an arithmetic process such as fast Fourier transform (FFT). The $f_{out}$ calculating circuit 23 may have any configuration as long as it can calculate the frequency of a signal input thereto and output the calculated $f_{out}$.

The phase difference calculating circuit 24 is a circuit for calculating a phase difference between two signals input thereto and thus calculates a phase difference $\theta_{out2}-\theta_{out1}$ or $\theta_{out1}-\theta_{out2}$ from the signals output by the quantizer 21 and the quantizer 22 and outputs the calculated phase difference to the n calculating circuit 25. The first input terminal of the phase difference calculating circuit 24 is connected to the output terminal of the quantizer 21, the second input terminal of the phase difference calculating circuit 24 is connected to the output terminal of the quantizer 22, and an output terminal of the phase difference calculating circuit 24 is connected to an input terminal of the n calculating circuit 25. For example, a logic circuit (also referred to as "digital circuit") such as an FPGA can be used as the phase difference calculating circuit 24. In a case where an FPGA is used, calculation can be performed by, for example, combining quadrature demodulation calculation and inverse tangent calculation. The phase difference calculating circuit 24 may have any configuration as long as it can calculate a phase difference between two signals input thereto and output the calculation result.

The n calculating circuit 25 calculates n from the calculation result of $\theta_{out2}-\theta_{out1}$ or $\theta_{out1}-\theta_{out2}$ output by the phase difference calculating circuit 24 using the phase difference $\theta_{CLK2}-\theta_{CLK1}$ between the first clock signal and the second clock signal and outputs the calculated n to the $f_{RF}$ calculating circuit 26. The input terminal of the n calculating circuit 25 is connected to the output terminal of the phase difference calculating circuit 24, and an output terminal of the n calculating circuit 25 is connected to a second input terminal of the $f_{RF}$ calculating circuit 26. For example, the n calculating circuit 25 includes an FPGA and a memory. The n calculating circuit 25 may have any configuration as long as it can calculate n from the signal output by the phase difference calculating circuit 24 using $\theta_{CLK2}-\theta_{CLK1}$ stored in a memory in advance and output the calculated n.

The $f_{RF}$ calculating circuit 26 calculates $f_{RF}$ from the signal indicating $f_{out}$ output by the $f_{out}$ calculating circuit 23 and the signal indicating n output by the n calculating circuit 25 and outputs the calculated $f_{RF}$. The first input terminal of the $f_{RF}$ calculating circuit 26 is connected to the output terminal of the $f_{out}$ calculating circuit 23, and the second input terminal of the $f_{RF}$ calculating circuit 26 is connected to the output terminal of the n calculating circuit 25. For example, an FPGA can be used as the $f_{RF}$ calculating circuit 26. The $f_{RF}$ calculating circuit 26 may have any configuration as long as it can calculate $f_{RF}$ from the signal indicating $f_{out}$ and the signal indicating n and output the calculated $f_{RF}$.

The signal source controlling circuit 27 outputs data indicating $\theta_{CLK1}$ and data indicating $\theta_{CLK2}$ to the signal source 13 and the signal source 14, respectively. A first output terminal of the signal source controlling circuit 27 is connected to the control terminal of the signal source 13, and a second output terminal of the signal source controlling circuit 27 is connected to the control terminal of the signal source 14. For example, an FPGA or a memory can be used as the signal source controlling circuit 27. The phases $\theta_{CLK1}$ and $\theta_{CLK2}$ may be obtained by calculation or may be read from data stored in advance in a memory or the like. The signal source controlling circuit 27 may have any configuration as long as it can output data indicating $\theta_{CLK1}$ and data indicating $\theta_{CLK2}$.

Next, the operation according to the first embodiment of the present invention will be described. Here, for the sake of simplicity of explanation, it is assumed that a signal received by the antenna 1 and a signal input to the frequency detection circuit 3 are a single wave having frequency $f_{RF}$. A PLL circuit is used as the signal source 13 and the signal source 14, an LPF is used as the filter 15 and the filter 16, and a circuit having the configuration of FIG. 2 is used as the frequency calculating circuit 17. It is also assumed that an ADC is used as the quantizer 21 and the quantizer 22, that an FPGA is used as the $f_{out}$ calculating circuit 23, the phase difference calculating circuit 24, and the $f_{RF}$ calculating circuit 26, and that an FPGA and a memory are used as the n calculating circuit 25. Note that the memory may be inside the FPGA or outside the FPGA. It is assumed that the ADCs used as the quantizer 21 and the quantizer 22 both perform quantization in synchronization with a third clock signal input from the outside and oversample. Note that it is assumed that the phase difference calculating circuit 24 calculates $\theta_{out2} - \theta_{out1}$.

First, in this receiver, the antenna 1 receives a signal having a frequency $f_{RF}$ propagated through space and outputs the signal to the amplifier 2. The amplifier 2 amplifies the reception signal output by the antenna 1 and outputs the amplified signal to the S/H circuit 11 and the S/H circuit 12.

The signal source 13 generates the first clock signal having an initial phase $\theta_{CLK1}$ and a frequency $f_{CLK}$ and outputs the first clock signal to the S/H circuit 11. The signal source 14 generates the second clock signal having an initial phase $\theta_{CLK2}$ and a frequency $f_{CLK}$ and outputs the second clock signal to the S/H circuit 12. The S/H circuit 11 undersamples the reception signal output by the amplifier 2 in synchronization with the first clock signal.

Figure 3:
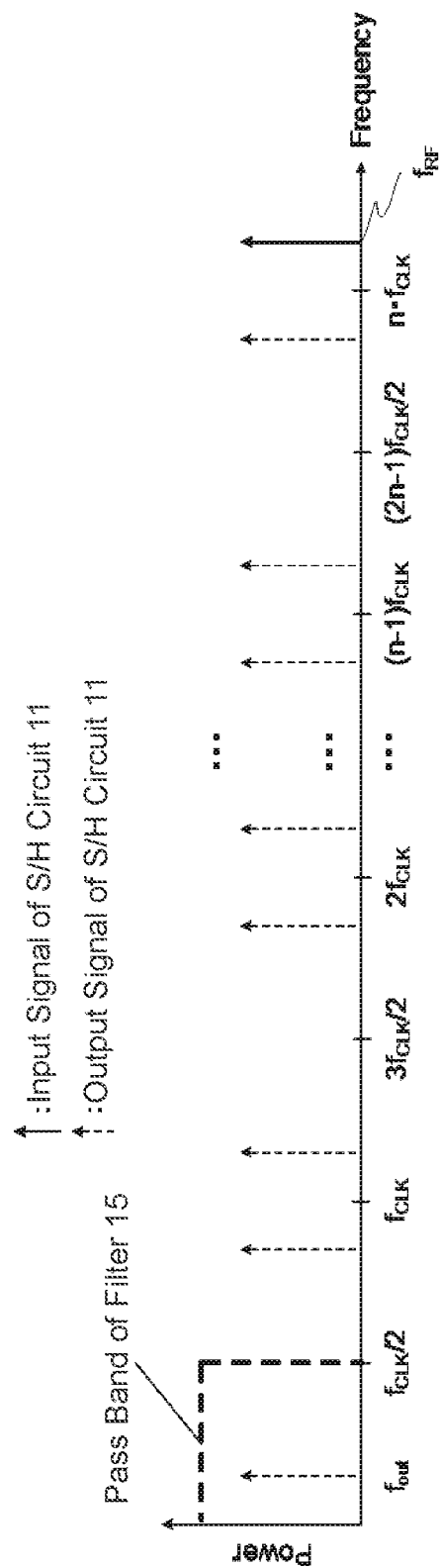
FIG. 3 is a diagram illustrating a frequency spectrum of an output signal of an S/H circuit 11 according to the first embodiment of the present invention.

FIG. 3 is a diagram illustrating a frequency spectrum of an output signal of the S/H circuit 11 according to the first embodiment of the present invention. The horizontal axis represents the frequency, and the vertical axis represents the power. A solid arrow represents an input signal of the S/H circuit 11, and a broken line arrow represents an output signal of the S/H circuit 11. The S/H circuit 11 undersamples the signal output by the amplifier 2 in accordance with the first clock signal output by the signal source 13. Due to undersampling, the output spectrum of the S/H circuit 11 has a loopback component at every frequency $f_{CLK}/2$ (hereinafter referred to as "Nyquist frequency"), which is half the frequency of the first clock signal. Here, the output signal of the S/H circuit 11 has a plurality of frequency components. This frequency is denoted by "$f_{S/H}$", and expressed by the following Equation 2.

$$f_{S/H} = |f_{RF} \pm \alpha \cdot f_{CLK}| \tag{2}$$

Note that "$\alpha$" is an integer. Here, among many frequency components included in the output signal of the S/H circuit 11, a component signal having the lowest frequency is allowed to pass through the filter 15. Here, "$f_{out}$" is expressed by the following Equation 3 or Equation 4.

$$f_{out} = f_{RF} - n \cdot f_{CLK} \text{ (when } f_{RF} \geq n \cdot f_{CLK}) \tag{3}$$

$$f_{out} = -f_{RF} + n \cdot f_{CLK} \text{ (when } f_{RF} < n \cdot f_{CLK}) \tag{4}$$

Phase "$\theta_{out1}$" is expressed by the following Equation 5 or Equation 6.

$$\theta_{out1} = \theta_{RF} - n \cdot \theta_{CLK} \text{ (when } f_{RF} \geq n \cdot f_{CLK}) \tag{5}$$

$$\theta_{out1} = -\theta_{RF} + n \cdot \theta_{CLK} \text{ (when } f_{RF} < n \cdot f_{CLK}) \tag{6}$$

The S/H circuit 12 undersamples the signal output by the amplifier 2 in accordance with the second clock signal output by the signal source 14. As a result, the output spectrum of the S/H circuit 12 has a loopback component at every Nyquist frequency. At this point, the output signal of the S/H circuit 12 includes a plurality of frequency components as in the output signal of the S/H circuit 11. Similarly to the filter 15 for the S/H circuit 11, among many frequency components included in the output signal of the S/H circuit 12, a component signal having the lowest frequency is allowed to pass through the filter 16. Here, "$f_{out}$" is expressed by the following Equation 7 or Equation 8.

$$f_{out} = f_{RF} - n \cdot f_{CLK} \text{ (when } f_{RF} \geq n \cdot f_{CLK}) \tag{7}$$

$$f_{out} = -f_{RF} + n \cdot f_{CLK} \text{ (when } f_{RF} < n \cdot f_{CLK}) \tag{8}$$

At this point, since the phases of input clock signals are different between the S/H circuit 11 and the S/H circuit 12 ($\theta_{CLK1} \neq \theta_{CLK2}$), the output signal of the S/H circuit 11 and the output signal of the S/H circuit 12 each has a frequency $f_{out}$, and $\theta_{out1}$ $\theta_{out2}$. That is, the output signal of the filter 15 and the output signal of the filter 16 have the same frequency but different phases. Here, "$\theta_{out2}$" is expressed by the following Equation 9 or Equation 10.

$$\theta_{out2} = \theta_{RF} - n \cdot \theta_{CLK2} \text{ (when } f_{RF} \geq n \cdot f_{CLK}) \tag{9}$$

$$\theta_{out2} = -\theta_{RF} + n \cdot \theta_{CLK2} \text{ (when } f_{RF} < n \cdot f_{CLK}) \tag{6}$$

Note that the filter 15 and the filter 16 are included in order to prevent malfunction due to input of a large number of frequency components to the frequency calculating circuit 17 or a failure due to input of a high-power frequency component to the frequency calculating circuit 17. Since each output signal of the S/H circuit 11 and the S/H circuit 12 includes a large number of frequency components other than $f_{out}$, the pass bands or mounting methods of the filters are determined so that frequency components other than $f_{out}$ can be sufficiently suppressed. In this case, the filter 15 and the filter 16 may be band pass filters (BPFs). Furthermore, in a case where no malfunctions or failures occur in the frequency calculating circuit 17, for example, in a case where the frequency components other than $f_{out}$ and included in the output signals of the S/H circuit 11 and the S/H circuit 12 are other than frequencies with which the frequency calculating circuit 17 can operate, or in a case where the power of those frequency components is low, the filter 15 and the filter 16 may not be included in this device, and the connection may be made with the frequency calculating circuit 17 via a through circuit.

The quantizer 21 quantizes the analog signal output by the filter 15 and outputs data of the quantized signal as a digital signal to the $f_{out}$ calculating circuit 23 and the phase difference calculating circuit 24. The quantizer 22 quantizes the analog signal output by the filter 16 and outputs the quantized result as a digital signal to the phase difference calculating circuit 24.

The $f_{out}$ calculating circuit 23 calculates the frequency of the digital signal output by the quantizer 21 and outputs the calculated frequency to the $f_{RF}$ calculating circuit 26. The phase difference calculating circuit 24 calculates $\theta_{out2} - \theta_{out1}$ from the signals output by the quantizer 21 and the quantizer 22 and outputs the calculation result to the n calculating circuit 25. Here $\theta_{out2} - \theta_{out1}$ can be expressed by the following Equation 11 or Equation 12.

$$\theta_{out2} - \theta_{out1} = n(\theta_{CLK1} - \theta_{CLK2}) \text{ (when } f_{RF} \geq n \cdot f_{CLK}) \tag{11}$$

$$\theta_{out2} - \theta_{out1} = n(\theta_{CLK2} - \theta_{CLK1}) \text{ (when } f_{RF} < n \cdot f_{CLK}) \tag{11}$$

From Equations 11 and 12, integer "n" is expressed by the following Equations 13 and 14.

[Equation 13]

$$n = -\frac{\theta_{out2} - \theta_{out1}}{\theta_{CLK2} - \theta_{CLK1}} \text{(when } f_{RF} \geq n \cdot f_{CLK}) \quad (13)$$

[Equation 14]

$$n = \frac{\theta_{out2} - \theta_{out1}}{\theta_{CLK2} - \theta_{CLK1}} \text{(when } f_{RF} < n \cdot f_{CLK}) \quad (14)$$

The n calculating circuit 25 calculates n from the data indicating $\theta_{out2}-\theta_{out1}$ input thereto using Equations 13 and 14 and $\theta_{CLK2}-\theta_{CLK1}$ stored in the memory in advance and outputs the calculated n to the $f_{RF}$ calculating circuit 26.

The $f_{RF}$ calculating circuit 26 calculates $f_{RF}$ from the signal indicating $f_{out}$ output by the $f_{out}$ calculating circuit 23 and the signal indicating n output by the n calculating circuit 25 using Equations 3 and 4 and outputs the calculated $f_{RF}$ to the outside of the frequency detection circuit 3.

Here, the calculation process of n and $f_{RF}$ will be described in detail. When the phase of a desired signal is calculated, in general, the calculation result is represented by a value greater than or equal to 0° and less than 360°. That is, even when $\theta_{out2}-\theta_{out1}=370°$, the phase difference calculating circuit 24 calculates as $\theta_{out2}-\theta_{out1}=10°$. Since a calculation result of the phase difference calculating circuit 24 includes such ambiguity (indefiniteness), it is necessary to appropriately set $\theta_{CLK1}$ and $\theta_{CLK2}$ in order to calculate $f_{RF}$ correctly.

Here, for the sake of simplicity of explanation, it is assumed that the frequency range intended to be detected by the frequency detection circuit 3 is from 3 to 10 GHz. First, a case where $f_{CLK}=1$ GHz, $\theta_{CLK1}=0°$, and $\theta_{CLK2}=10°$ are set and $f_{out}=0.1$ GHz and $\theta_{out2}-\theta_{out1}=330°$ are obtained will be described.

Considering the ambiguity of $\theta_{out2}-\theta_{out1}$, it can be expressed as $\theta_{out2}-\theta_{out1}=330°+\beta \cdot 360°$. Note that 13 is an integer. Substituting $\theta_{out2}-\theta_{out1}=330°+\beta \cdot 360°$ and $\theta_{CLK1}-\theta_{CLK2}=10°$ into Equation 11 gives n=−33−36β. Substituting n into Equation 3 and further substituting $f_{out}=0.1$ GHz into Equation 3 gives $f_{RF}=-33-36\beta+0.1$ GHz. Since the frequency range to be detected by this frequency detection circuit 3 is 3 to 10 GHz, β that satisfies this is solely −1, and n=3 is obtained. With this, it can be calculated that $f_{RF}=3.1$ GHz.

Considering Equation 12 in the same manner, n=33+36β. Substituting n into Equation 4 and further substituting $f_{out}=0.1$ GHz into Equation 4 gives $f_{RF}=33+36\beta-0.1$ GHz. Since the frequency range to be detected by the frequency detection circuit 3 is 3 to 10 GHz, there is no β that satisfies $f_{RF}$ obtained from Equation 4. With this, it can be uniquely calculated as n=3 and $f_{RF}=3.1$ GHz.

Next, a case where $f_{CLK}=1$ GHz, $\theta_{CLK1}=0°$, and $\theta_{CLK2}=90°$ are set and $f_{out}=0.1$ GHz and $\theta_{out2}-\theta_{out1}=90°$ are obtained will be described.

Considering the ambiguity of $\theta_{out2}-\theta_{out1}$, the actual $\theta_{out2}-\theta_{out1}$ is $90°+\beta \cdot 360°$. From this and Equation 11, n=−1−4β is obtained. Substituting n into Equation 3 and further substituting $f_{out}=0.1$ GHz into Equation 3 gives $f_{RF}=-1-4\beta+0.1$ GHz. Since the frequency range to be detected by the frequency detection circuit 3 is 3 to 10 GHz, β that satisfies this has two values of −1 and −2, that is, n=3, 7. With this, $f_{RF}=3.1$ or 7.1 GHz.

Considering Equation 12 in the same manner, n=1+4β. Substituting n into Equation 4 and further substituting $f_{out}=0.1$ GHz into Equation 4 gives $f_{RF}=1+4\beta-0.1$ GHz. Since the frequency range to be detected by the frequency detection circuit 3 is 3 to 10 GHz, β that satisfies this has two values of 1 and 2, that is, n=5, 9. With this, $f_{RF}=4.9$ or 8.9 GHz. At this point, n and $f_{RF}$ cannot be uniquely determined, and $f_{RF}$ cannot be identified correctly.

In this manner, $f_{RF}$ cannot be uniquely calculated unless $\theta_{CLK1}$ and $\theta_{CLK2}$ are set appropriately. In order to calculate $f_{RF}$ uniquely, when let "$f_x$" be the maximum frequency to be detected by the frequency detection circuit 3 and the phase range that can be detected by the phase difference calculating circuit 24 is in the range from $\theta_1$ to $\theta_2$ (for example, 0° to 360°), it is necessary to determine $\theta_{CLK1}$ and $\theta_{CLK2}$ so that the following Inequation 15 is satisfied.

[Inequation 15]

$$\theta_{CLK2} - \theta_{CLK1} < \frac{\theta_2 - \theta_1}{\text{round}\left(\frac{f_x}{f_{CLK}}\right)} \quad (15)$$

The signal source controlling circuit 27 outputs data indicating $\theta_{CLK1}$ and $\theta_{CLK2}$ calculated so that Inequation 15 is satisfied. Although not illustrated in FIG. 2, the calculation of $\theta_{CLK1}$ and $\theta_{CLK2}$ may be performed by the signal source controlling circuit 27, or the result of calculation performed outside the frequency calculating circuit 17 may be input to and stored in the signal source controlling circuit 27.

As described above, according to the first embodiment, an RF signal (reception signal) is undersampled using the two S/H circuits to which clock signals having the same frequency but different phases are input, and the order of undersampling for the RF signal is obtained from the frequencies of output signals of the S/H circuits and a phase difference between the output signals of the two S/H circuits, and the frequency of the RF signal can be identified from the order. Since the frequency of the RF signal can be identified by the two S/H circuits regardless of the frequency of the RF signal, the circuit scale does not increase even when the RF signal has a higher frequency. Moreover, the sampling frequency (frequencies of the clock signals) does not need to be increased either. This enables implementation of a frequency detection circuit in which an increase of the power consumption is suppressed.

In the above description, the case where the $f_{out}$ calculating circuit 23 calculates the frequency of an output signal of the quantizer 21 has been described; however, the $f_{out}$ calculating circuit 23 may calculate the frequency of an output signal of the quantizer 22. Furthermore, although the case where the phase difference calculating circuit 24 calculates the value of $\theta_{out2}-\theta_{out1}$ has been described here, the phase difference calculating circuit 24 may calculate the value of $\theta_{out1}-\theta_{out2}$. However, at this point in the n calculating circuit 25, n is calculated using equations obtained by adding a minus sign to the right sides of Equations 11 and 12.

In the first embodiment, circuits for converting the frequency of a reception signal are the S/H circuit 11 and the S/H circuit 12; however, frequency conversion circuits may be included between the output terminal of the antenna 1 and the first and second input terminals of the frequency calculating circuit 17 as long as RF signals input to the S/H circuit 11 and the S/H circuit 12 are the same and the frequencies of output signals of the filter 15 and the filter 16 are the same. As a frequency conversion circuit, for example, a frequency divider, a multiplier, a mixer, or an S/H circuit can be used.

In the above description, the signal source 13 and the signal source 14 are used to generate the first clock signal and the second clock signal; however, the first clock signal and the second clock signal may be generated using other circuits as long as the first and second clock signals have the same frequency and different phases. For example, a signal source, a power distributor, and a phase shifter can be used. In this case, it is only required that a signal output by the signal source is divided into two signals by the power distributor, that one of the signals is used as a first clock signal, and that the phase of the other signal is shifted by the phase shifter to obtain a second clock signal.

Here, among the signals output by the S/H circuit 11 and the S/H circuit 12, the filter 15 and the filter 16 are used to pass a signal having a component of the lowest frequency; however, a signal having another frequency component may be passed. As long as $f_{out} \neq f_{RF}$ is satisfied, it may be a signal having a frequency component outside the first Nyquist zone.

Note that although $\theta_{out2}-\theta_{out1}$ is calculated here by the digital circuit after the output signals of the filter 15 and the filter 16 are quantized using the quantizer 21 and the quantizer 22, quantization may be performed after $\theta_{out2}-\theta_{out1}$ is extracted by an analog circuit.

Figure 4:
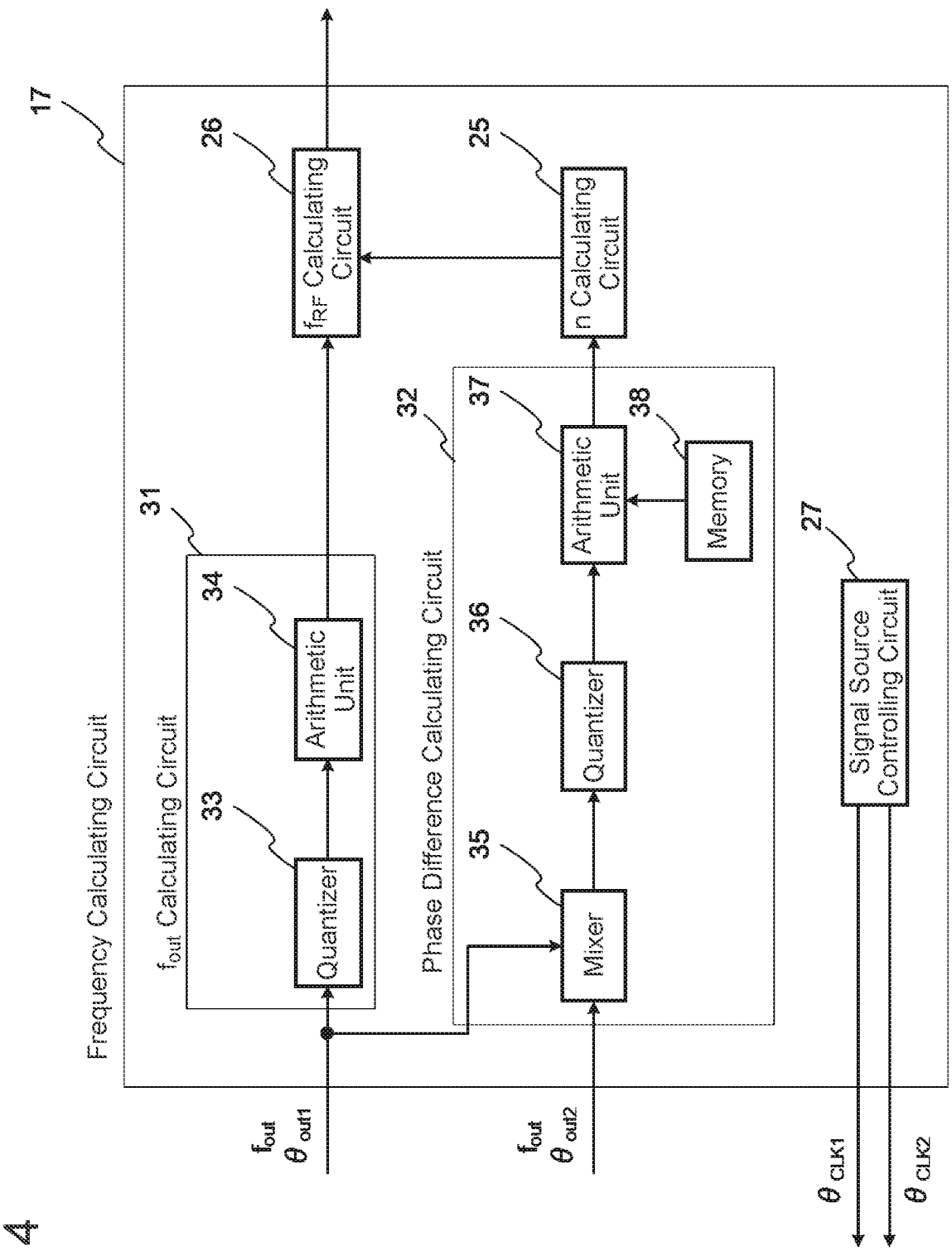
FIG. 4 is a configuration diagram illustrating another configuration example of the frequency calculating circuit 17 according to the first embodiment of the present invention.

FIG. 4 is a configuration diagram illustrating another configuration example of the frequency calculating circuit 17 according to the first embodiment of the present invention. In an $f_{out}$ calculating circuit 31, a quantizer 33 quantizes an output signal of the filter 15, and an arithmetic unit 34 performs an arithmetic processing such as FFT and calculates $f_{out}$. In a phase difference calculating circuit 32, first, a mixer 35 mixes two analog signals output by the filter 15 and the filter 16 and outputs an analog signal indicating the phase difference between the two signals to a quantizer 36. The quantizer 36 quantizes the analog signal indicating the phase difference and outputs the result to an arithmetic unit 37. Here, the output signal of the mixer 35 does not indicate the value of $\theta_{out2}-\theta_{out1}$ itself but uniquely corresponding to $\theta_{out2}-\theta_{out1}$. The arithmetic unit 37 reads, from a memory 38 in which the correspondence between the signal indicating the phase difference and $\theta_{out2}-\theta_{out1}$ is stored in advance, the value of $\theta_{out2}-\theta_{out1}$ with respect to the signal indicating the phase difference output by the mixer 35 and outputs data indicating $\theta_{out2}-\theta_{out1}$ to the n calculating circuit 25. Note that the arithmetic unit 37 includes, for example, an FPGA.

Meanwhile, although n is an integer here, in a case where n calculated by the n calculating circuit 25 is a decimal of a value close to an integer due to fluctuation in performance of the circuit, the decimal n may be, for example, rounded off to an integer.

In the above description, the signal input to the frequency detection circuit 3 is a single wave having a frequency $f_{RF}$, however, a plurality of waves may be input. In the case of a plurality of waves, output signals of the S/H circuit 11 and the S/H circuit 12 also include a plurality of signals within the first Nyquist zone. In this case, since the output signal of the filter 15 and the output signal of the filter 16 have the same frequency but different phases, the frequency of the reception signal can be identified in a similar manner to the case of a single wave.

However, in a case where $f_{RF}$ is an integral multiple of the Nyquist frequency (hereinafter referred to as "event A"), since $f_{out}$ is a DC (direct current) component due to undersampling in the S/H circuit 11 and the S/H circuit 12, and its phase information is unavailable, $f_{RF}$ cannot be identified. Although not illustrated in FIG. 2, in a case where $f_{out}$ is a DC component as a result of calculation of $f_{out}$ made by the $f_{out}$ calculating circuit 23, this may be notified to the outside. Furthermore, it may be controlled to modify $f_{CLK}$ on the basis of the notification result and to avoid the frequency relationship of event A.

Meanwhile, in a case where a signal input to the frequency detection circuit 3 includes a plurality of waves and signals generated by undersampling the plurality of waves by the S/H circuit 11 and the S/H circuit 12 (output signals of the S/H circuit 11 and the S/H circuit 12 for the plurality of waves) have the same frequency in the first Nyquist zone (hereinafter referred to as "event B"), the phase relationship cannot be expressed by Equations 5 to 8, and thus n calculated by the n calculating circuit 25 is a value that is out of the frequency range to be detected by the frequency detection circuit 3 or a decimal that is far from an integer. Due to this, the frequency cannot be identified correctly. Although not illustrated in FIG. 2, a circuit for monitoring the calculation result of n in the n calculating circuit 25 may be provided, and notification may be made to the outside when n is a value outside the frequency range to be detected by the frequency detection circuit 3 or a decimal significantly far from an integer. Furthermore, it may be controlled to modify $f_{CLK}$ on the basis of the notification result and to avoid the frequency relationship of event B.

Second Embodiment

In the first embodiment, in cases of frequency relationships that cause event A or event B, $f_{RF}$ cannot be identified correctly, or it takes time to correctly detect $f_{RF}$ since $f_{CLK}$ is modified so that frequency relationships that cause event A and event B are avoided after it is made clear that $f_{RF}$ cannot be identified. In a second embodiment, two frequency detection circuits illustrated in the first embodiment are used, and clock signals input to S/H circuits in each of the frequency detection circuits are set to have different frequencies, thereby allowing either one of the frequency detection circuits to avoid event A and event B to identify the correct $f_{RF}$.

Figure 5:
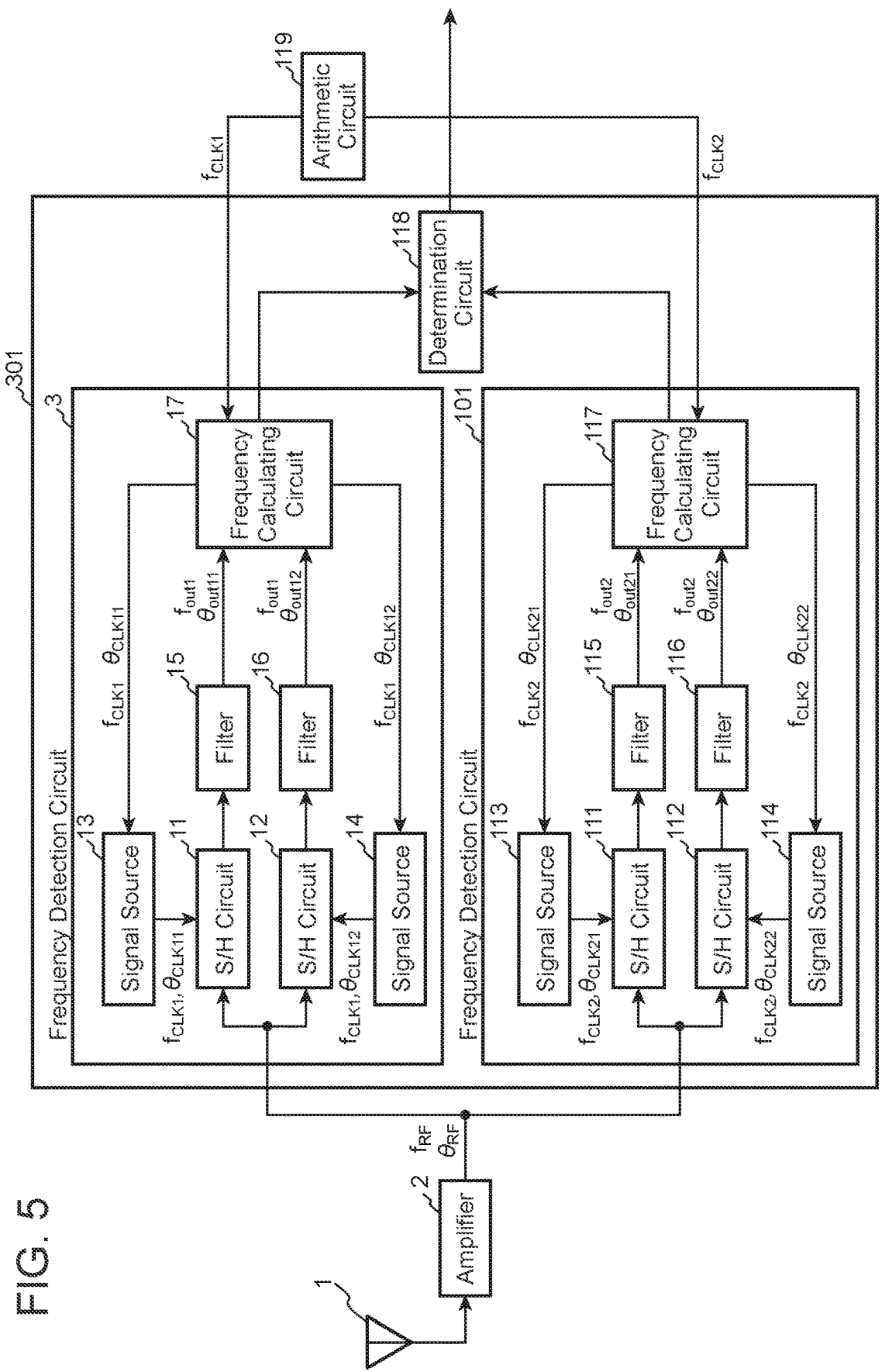
FIG. 5 is a configuration diagram illustrating a configuration example of a receiver according to a second embodiment of the present invention.

FIG. 5 is a configuration diagram illustrating a configuration example of a receiver according to the second embodiment of the present invention. A frequency detection circuit 301 includes a frequency detection circuit 3 and a frequency detection circuit 101 that have frequencies for undersampling that are different from each other. In FIG. 5, the same symbol as that in FIG. 1 denotes the same or a corresponding part, and description thereof is omitted.

Symbol "$f_{CLK1}$" denotes the frequency of output signals of a signal source 13 and a signal source 14, "$\theta_{CLK11}$" denotes the initial phase of an output signal of the signal source 13, "$\theta_{CLK12}$" denotes the initial phase of an output signal of the signal source 14, "$f_{out1}$" denotes the frequency of an output signal of a filter 15, "$\theta_{out11}$" denotes the initial phase of an output signal of the filter 15, "$\theta_{out12}$" denotes the initial phase of an output signal of a filter 16, "$f_{CLK2}$" denotes the frequency of output signals of a signal source 113 and a signal source 114, "$\theta_{CLK21}$" denotes the initial phase of an output signal of the signal source 113, "$\theta_{CLK22}$" denotes the initial phase of an output signal of the signal source 114, "$f_{out2}$" denotes the frequency of an output signal of a filter 115, "$\theta_{out21}$" denotes the initial phase of an output signal of the filter 115, and "$\theta_{out22}$" denotes the initial phase of an output signal of a filter 116.

The frequency detection circuit 101 identifies the frequency of a signal input thereto and outputs a signal indicating the frequency. The frequency detection circuit 101 identifies $f_{RF}$ from a signal output by the amplifier 2 and outputs a signal indicating $f_{RF}$ to a determination circuit 118. An input terminal of the frequency detection circuit 101 is connected to an output terminal of the amplifier 2, and an output terminal of the frequency detection circuit 101 is connected to a second input terminal of the determination circuit 118.

An S/H circuit 111 is a sample and hold circuit that undersamples the signal output by the amplifier 2 in synchronization with a third clock signal output by the signal source 113 and outputs the undersampled signal to the filter 115. An RF terminal of the S/H circuit 111 is connected to the output terminal of the amplifier 2, a clock terminal of the S/H circuit 111 is connected to an output terminal of the signal source 113, and an output terminal of the S/H circuit 111 is connected to an input terminal of the filter 115. For example, as the S/H circuit 111, a circuit is used, which includes a switch for switching between open and short for a line for an RF signal input thereto (output signal of the amplifier 2) and a capacitor for storing charges when the line is open for the RF signal input thereto. The S/H circuit 111 may have any configuration as long as it can undersample an RF signal input thereto and output the undersampled signal.

An S/H circuit 112 is a sample and hold circuit that undersamples the signal output by the amplifier 2 in synchronization with a fourth clock signal output by the signal source 114 and outputs the undersampled signal to the filter 116. An RF terminal of the S/H circuit 112 is connected to the output terminal of the amplifier 2, a clock terminal of the S/H circuit 112 is connected to an output terminal of the signal source 114, and an output terminal of the S/H circuit 112 is connected to an input terminal of the filter 116. For example, as the S/H circuit 112, a circuit is used, which includes a switch for switching between open and short for a line for an RF signal input thereto and a capacitor for storing charges when the line is open for the RF signal input thereto. The S/H circuit 112 may have any configuration as long as it can undersample an RF signal input thereto and output the undersampled signal.

The signal source 113 is capable of generating a signal having a desirable signal waveform or a desirable frequency and is a circuit that generates the third clock signal to be input to the S/H circuit 111. The output terminal of the signal source 113 is connected to the clock terminal of the S/H circuit 111. For example, a DAC, a DDS, or a PLL circuit is used as the signal source 113. Note that, although not illustrated in FIG. 5, the signal source 113 may generate the third clock signal using a control signal or a reference signal input from the outside. As the signal source 113, any circuit may be used as long as it can generate a signal having a desired signal waveform or a desired frequency.

The signal source 114 is capable of generating a signal having a desirable signal waveform or a desirable frequency and is a circuit that generates the fourth clock signal to be input to the S/H circuit 112. The output terminal of the signal source 114 is connected to the clock terminal of the S/H circuit 112. For example, a DAC, a DDS, or a PLL circuit is used as the signal source 114. Note that, although not illustrated in FIG. 5, the signal source 114 may generate the fourth clock signal using a control signal or a reference signal input from the outside. As the signal source 114, any circuit may be used as long as it can generate a signal having a desired signal waveform or a desired frequency.

The filter 115 has a predetermined pass band, part of the signals output by the S/H circuit 111 being allowed to pass through the filter as being within the pass band, and the remaining part of the signals being suppressed by the filter as being outside the pass band. The filter 115 suppresses signals and unnecessary waves outside the pass band out of the signal output by the S/H circuit 111 and outputs the signal to the frequency calculating circuit 117. The input terminal of the filter 115 is connected to the output terminal of the S/H circuit 111, and an output terminal of the filter 115 is connected to a first input terminal of the frequency calculating circuit 117. For example, the filter 115 is implemented using a chip inductor, a chip capacitor, or the like. Depending on a frequency band to be passed or the amount of suppression required, another microstrip or a resonator such as a coaxial resonator may be used.

The filter 116 has a predetermined pass band, part of the signals output by the S/H circuit 112 being allowed to pass through the filter as being within the pass band, and the remaining part of the signals being suppressed by the filter as being outside the pass band. The filter 116 suppresses signals and unnecessary waves outside the pass band out of the signal output by the S/H circuit 112 and outputs the signal to the frequency calculating circuit 117. The input terminal of the filter 116 is connected to the output terminal of the S/H circuit 112, and an output terminal of the filter 116 is connected to a second input terminal of the frequency calculating circuit 117. For example, the filter 116 is implemented using a chip inductor, a chip capacitor, or the like. Depending on a frequency band to be passed or the amount of suppression required, another microstrip or a resonator such as a coaxial resonator may be used.

The frequency calculating circuit 117 identifies $f_{RF}$ from the signals output by the filter 115 and the filter 116. The first input terminal of the frequency calculating circuit 117 is connected to the output terminal of the filter 115, the second input terminal of the frequency calculating circuit 117 is connected to the output terminal of the filter 116, and an output terminal of the frequency calculating circuit 117 is connected to the second input terminal of the determination circuit 118. As the frequency calculating circuit 117, for example, the configuration illustrated in FIG. 2 can be used.

The determination circuit 118 determines which $f_{RF}$ is correct with respect to the signals indicating $f_{RF}$ that are output by the frequency calculating circuit 17 and the frequency calculating circuit 117. The first input terminal of the determination circuit 118 is connected to the output terminal of the frequency calculating circuit 17, and the second input terminal of the determination circuit 118 is connected to the output terminal of the frequency calculating circuit 117. As the determination circuit 118, for example, an FPGA can be used.

An arithmetic circuit 119 calculates $f_{CLK1}$ and $f_{CLK2}$ so that frequency relationships that cause event A and event B are avoided and outputs the calculated $f_{CLK1}$ and $f_{CLK2}$ via the frequency calculating circuit 17 and the frequency calculating circuit 117 to the signal sources 13 and 14 and the signal sources 113 and 114, respectively. The arithmetic circuit 119 determines $f_{CLK1}$ and $f_{CLK2}$ in advance so that frequency relationships that cause event A or event B are avoided. For example, a computer including a central processing unit (CPU) and a memory, a microcomputer, or an FPGA can be used as the arithmetic circuit; however, any arithmetic circuit may be used as long as the determination flow of $f_{CLK1}$ and $f_{CLK2}$ described below can be executed.

Next, the operation of the receiver including the frequency detection circuit 301 according to the second embodiment of the present invention will be described. Note that, in both the frequency detection circuit 3 and the frequency detection circuit 101, the operation other than in the case of frequency relationships that cause event A and event B is the same as in the first embodiment, and thus description thereof will be omitted. It is assumed here that, as the frequency calculating circuit 17 and the frequency calculating circuit 117, the configuration illustrated in FIG. 2 is used.

If either one of the frequency detection circuit 3 and the frequency detection circuit 101 has a frequency relationship that causes event A or event B, that frequency detection circuit cannot correctly identify $f_{RF}$, and thus the identified $f_{RF}$ is a frequency outside a frequency range that can be detected by the frequency detection circuit. However, in the other frequency detection circuit, the frequency of a clock signal used for undersampling is different from the frequency of a clock signal of the frequency detection circuit that cannot correctly identify $f_{RF}$, and thus frequency relationships of event A and event B can be avoided, thereby allowing $f_{RF}$ to be correctly identified. Event A and event B occur when the frequency of a reception signal and the frequency of a clock signal are in a certain combination. Meanwhile, the reception signals input to the two frequency detection circuits are not different in frequency from each other, whereas the clock signals are different in frequency from each other, therefore, when the relationship is satisfied in one of the frequency detection circuits, the other frequency detection circuit does not satisfy event A nor event B. Therefore, either one of the frequency detection circuits can correctly identify $f_{RF}$.

In the determination circuit 118, the correct $f_{RF}$ is identified from the signals indicating $f_{RF}$ output by each of the frequency detection circuit 3 and the frequency detection circuit 101. At this point, for example in the determination circuit 118, first, the signals indicating $f_{RF}$ output by each of the frequency detection circuit 3 and the frequency detection circuit 101 are compared, and if they are the same, the signal indicating $f_{RF}$ is output as it is, and if they are different, it is determined whether or not the signals indicating $f_{RF}$ are within the frequency ranges that can be detected by the frequency detection circuit 3 and the frequency detection circuit 101, and a signal indicating the correct $f_{RF}$ is output.

Note that there is a case where the calculated $f_{RF}$ is within a frequency range that can be detected by the frequency detection circuit 3 and the frequency detection circuit 101 even in a case where either one of the frequency detection circuit 3 and the frequency detection circuit 101 has a frequency relationship of event A or event B. Therefore, although not illustrated in FIG. 5, the determination circuit 118 may identify the correct $f_{RF}$ using the value of n in addition to $f_{RF}$ calculated by the frequency detection circuit 3 and the frequency detection circuit 101. At this point, the correct $f_{RF}$ can be identified by a calculation procedure such as regarding $f_{RF}$ calculated by a frequency detection circuit as an error when the calculated n is a decimal significantly far from an integer.

In a case where a frequency relationship of event A or event B is established in both the frequency detection circuit 3 and the frequency detection circuit 101, $f_{RF}$ cannot be correctly identified. Therefore, in the present embodiment, it is necessary to set $f_{CLK1}$ and $f_{CLK2}$ so that frequency relationships of event A or event B are avoided.

Figure 6:
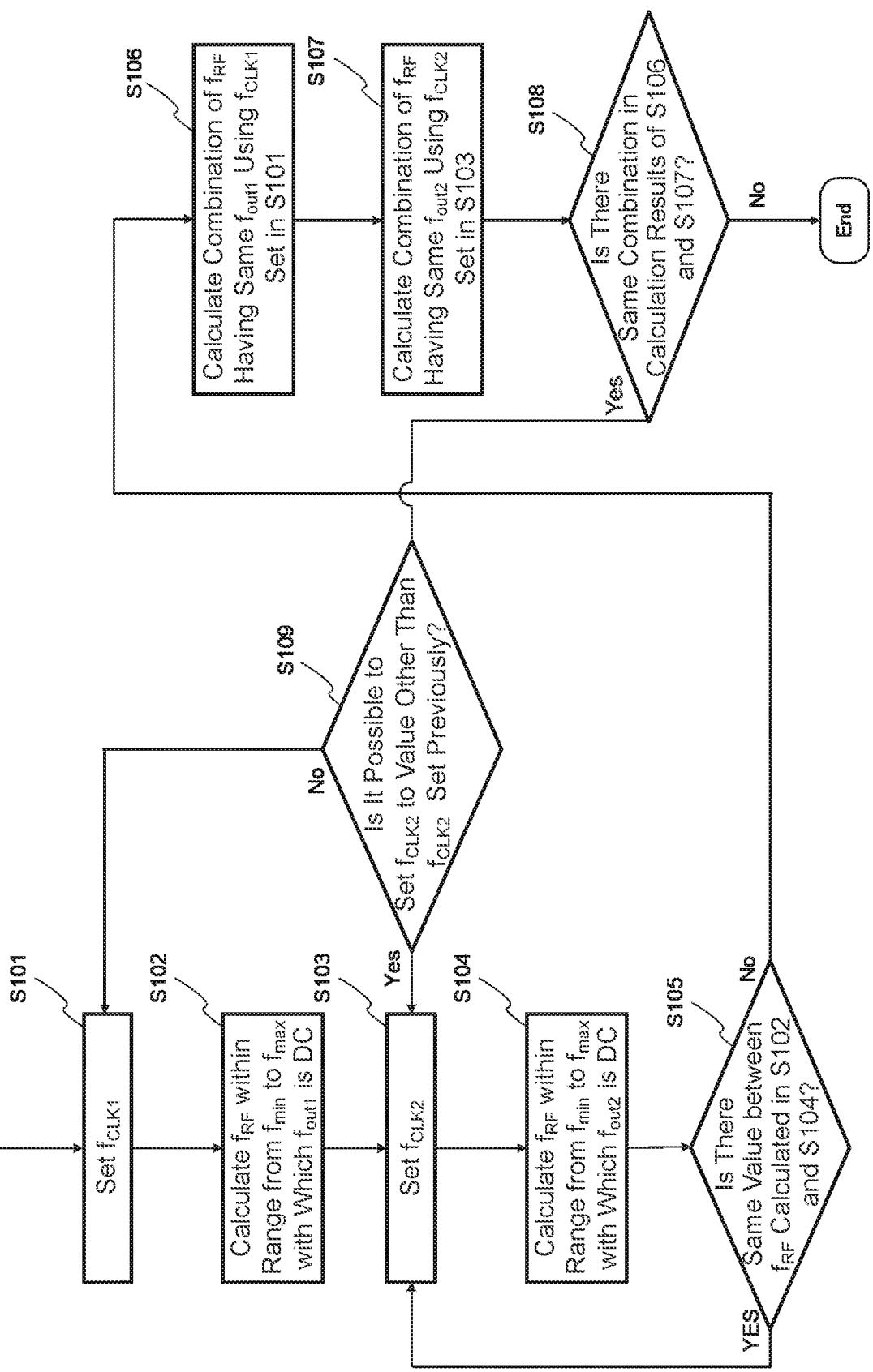
FIG. 6 is a flowchart illustrating an example of a setting procedure of $f_{CLK1}$ and $f_{CLK2}$ in an arithmetic circuit 119 of a frequency detection circuit according to the second embodiment of the present invention.

FIG. 6 is a flowchart illustrating an example of a setting procedure of $f_{CLK1}$ and $f_{CLK2}$ in the arithmetic circuit 119 of the frequency detection circuit according to the second embodiment of the present invention. Here, it is assumed that the frequency range that can be detected by the frequency detection circuit 3 and the frequency detection circuit 101 is from $f_{min}$ to $f_{max}$.

In step S101, first, the arithmetic circuit 119 sets $f_{CLK1}$.

Next, in step S102, the arithmetic circuit 119 calculates $f_{RF}$ with which $f_{out1}$ is a DC component in the range from $f_{min}$ to $f_{max}$ from $f_{CLK1}$ defined in step S101. Note that there may be one or more values for $f_{RF}$.

Next, in step S103, the arithmetic circuit 119 sets $f_{CLK2}$.

Next, in step S104, the arithmetic circuit 119 calculates $f_{RF}$ with which $f_{out2}$ is a DC component in the range from $f_{min}$ to $f_{max}$ from $f_{CLK2}$ defined in step S103. Note that there may be one or more values for $f_{RF}$.

Next, in step S105, the arithmetic circuit 119 compares $f_{RF}$ obtained in step S102 and $f_{RF}$ obtained in step S104 and determines whether or not there is the same value. If there is no $f_{RF}$ of the same value, the process proceeds to step S106. If there is $f_{RF}$ of the same value, the process proceeds to step S103, and the arithmetic circuit 119 sets $f_{CLK2}$ to a value different from the value previously set in step S103.

Next, in step S106, the arithmetic circuit 119 calculates a combination of $f_{RF}$ having the same $f_{out1}$ using $f_{CLK1}$ set in step S101. For example, when $f_{CLK1}$=1 GHz, the combination of $f_{RF}$=1.1 GHz and $f_{RF}$=1.9 GHz has the same $f_{out}'$=0.1 GHz.

Next, in step S107, the arithmetic circuit 119 calculates a combination of $f_{RF}$ having the same $f_{out2}$ using $f_{CLK2}$ set in step S103. For example, when $f_{CLK}2$=1.5 GHz, the combination of $f_{RF}$=1.6 GHz and $f_{RF}$=2.9 GHz has the same $f_{out}2$=0.1 GHz.

Next, in step S108, the arithmetic circuit 119 compares the calculation result of step S106 and the calculation result of step S107 and determines whether or not there is a combination of the same $f_{RF}$. If there is the same combination, the process proceeds to step S109. If there is no same combination, the arithmetic circuit 119 outputs $f_{CLK1}$ and $f_{CLK2}$ to the frequency calculating circuit 17 of the frequency detection circuit 3 and the frequency calculating circuit 117 of the frequency detection circuit 101, respectively, and ends the flow.

After the flow is completed, the frequency calculating circuit 17 outputs $f_{CLK1}$ to the signal source 13 and the signal source 14, and the signal source 13 and the signal source 14 set the clock frequency to $f_{CLK1}$. Similarly, the frequency calculating circuit 117 outputs $f_{CLK2}$ to the signal source 113 and the signal source 114, and the signal source 113 and the signal source 114 set the output clock frequency to $f_{CLK2}$.

Next, in step S109, the arithmetic circuit 119 determines whether or not $f_{CLK2}$ can be set to a value other than $f_{CLK2}$ that has been set in the preceding flow. At this point, the determination is made in consideration of $f_{CLK2}$ that has been set in the preceding flow and the frequency setting ranges of the signal source 113 and the signal source 114. For example, in a case where the signal source 113 and the signal source 114 are PLL circuits with an output frequency range of 1 to 2 GHz and a resolution of 0.5 GHz, there are three $f_{CLK2}$ that can be set: 1 GHz, 1.5 GHz, and 2 GHz, and it is determined whether or not all the three values have been set as $f_{CLK2}$ in the preceding flow. If $f_{CLK2}$ can be set to another value within the frequency setting range, the process proceeds to step S103, and the arithmetic circuit 119 sets $f_{CLK2}$ to the other value. On the other hand, if $f_{CLK2}$ cannot be set to another value within the frequency setting range, the process proceeds to step S101, and the arithmetic circuit 119 sets $f_{CLK1}$ to a value different from the value that has been previously set.

As described above, according to the second embodiment, a similar effect to that of the frequency detection circuit of the first embodiment can be obtained. In addition, by using two frequency detection circuits and setting clock signals of the respective frequency detection circuits to frequencies different from each other, even in a case where one of the frequency detection circuits has a frequency relationship of event A or event B, this frequency relationship can be avoided in the other frequency detection circuit, thereby enabling correct identification of $f_{RF}$. As a result, the frequency detection circuit according to the second embodiment can improve the reliability of frequency detection.

REFERENCE SIGNS LIST

1: antenna,
2: amplifier,
3, 101, 301: frequency detection circuit,
11, 12, 111, and 112: S/H circuit,
13, 14, 113, and 114: signal source,
15, 16, 115, and 116: filter,
17 and 117: frequency calculating circuit,
21, 22, 33, and 36: quantizer,
23 and 31: $f_{out}$ calculating circuit,
24 and 32: phase difference calculating circuit,
25: n calculating circuit,
26: $f_{RF}$ calculating circuit,
27: signal source controlling circuit,
34 and 37: arithmetic unit,
35: mixer,
38: memory,
118: determination circuit,
119: arithmetic circuit

What is claimed is:

1. A frequency detection circuit comprising:
a first signal source to output a first clock signal;
a second signal source to output a second clock signal having a same frequency as but a different phase from those of the first clock signal;
a first sample hold circuit to undersample a reception signal using the first clock signal, and to output the undersampled reception signal as an output signal;
a second sample hold circuit to undersample the reception signal using the second clock signal, and to output the undersampled reception signal as an output signal; and
a frequency calculating circuit to calculate a frequency of the reception signal using a phase difference between the output signals of the first sample hold circuit and the second sample hold circuit, wherein
the frequency calculating circuit detects a frequency of the output signal of the first sample hold circuit, calculates an order of undersampling with respect to the reception signal using the phase difference, and calculates the frequency of the reception signal from the calculated order and the detected frequency.

2. The frequency detection circuit according to claim 1, wherein the frequency calculating circuit calculates the order of undersampling with respect to the reception signal from a phase difference between the first clock signal and the second clock signal and the phase difference between the output signals of the first sample hold circuit and the second sample hold circuit.

3. The frequency detection circuit according to claim 2, wherein when a phase of the first clock signal is denoted by "$\theta_{CLK1}$", a phase of the second clock signal is denoted by "$\theta_{CLK2}$", a phase of the output signal of the first sample hold circuit is denoted by "$\theta_{out1}$", and a phase of the output signal of the second sample hold circuit is denoted by "$\theta_{out2}$", the frequency calculating circuit obtains "n" as the order of undersampling from the following equation:

$$n = -\frac{\theta_{out2} - \theta_{out1}}{\theta_{CLK2} - \theta_{CLK1}}.$$

4. The frequency detection circuit according to claim 3, wherein when the frequency of the first clock signal is denoted by "$f_{CLK}$", the order of undersampling is denoted by "n", and the frequency of the output signal of the first sample hold circuit is denoted by "$f_{out}$", the frequency calculating circuit calculates "$f_{RF}$" as the frequency of the reception signal from the following equation:

$$f_{out} = f_{RF} - n \cdot f_{CLK}$$

5. The frequency detection circuit according to claim 2, wherein when a phase of the first clock signal is denoted by "$\theta_{CLK1}$", a phase of the second clock signal is denoted by "$\theta_{CLK2}$", a phase of the output signal of the first sample hold circuit is denoted by "$\theta_{out1}$", and a phase of the output signal of the second sample hold circuit is denoted by "$\theta_{out2}$", the frequency calculating circuit obtains "n" as the order of undersampling from the following equation:

$$n = \frac{\theta_{out2} - \theta_{out1}}{\theta_{CLK2} - \theta_{CLK1}}.$$

6. The frequency detection circuit according to claim 5, wherein when the frequency of the first clock signal is denoted by "$f_{CLK1}$", the order of undersampling is denoted by "n", and the frequency of the output signal of the first sample hold circuit is denoted by "$f_{out}$", the frequency calculating circuit calculates "$f_{RF}$" as the frequency of the reception signal from the following equation:

$$f_{out} = -f_{RF} + n \cdot f_{CLK}$$

7. The frequency detection circuit according to claim 1, wherein the frequency calculating circuit outputs phase information of the first clock signal and phase information of the second clock signal to the first signal source and the second signal source, respectively.

8. A frequency detection circuit comprising:
a first frequency detection circuit to calculate the frequency of the reception signal, the first frequency detection circuit being the same in configuration as the frequency detection circuit according to claim 1;
a second frequency detection circuit to undersample at a frequency different from the frequency of the first clock signal of the first frequency detection circuit and to calculate the frequency of the reception signal, the second frequency detection circuit being the same in configuration as the frequency detection circuit according to claim 1; and
a determination circuit to determine the frequency of the reception signal by comparing the frequency of the reception signal calculated by the first frequency detection circuit and the frequency of the reception signal calculated by the second frequency detection circuit.

9. The frequency detection circuit according to claim 8, wherein the determination circuit compares the order of undersampling calculated by the first frequency detection circuit and the order of undersampling calculated by the second frequency detection circuit and determines the frequency of the reception signal.

* * * * *